United States Patent
Haneder et al.

(10) Patent No.: US 6,707,082 B2
(45) Date of Patent: Mar. 16, 2004

(54) FERROELECTRIC TRANSISTOR

(75) Inventors: Thomas Peter Haneder, Dachau (DE); Harald Bachhofer, München (DE); Eugen Unger, Augsburg (DE)

(73) Assignee: Infineon Technologies, Munich (DE)

( * ) Notice: Subject to any disclaimer, the term of this patent is extended or adjusted under 35 U.S.C. 154(b) by 0 days.

(21) Appl. No.: 10/112,272

(22) Filed: Mar. 28, 2002

(65) Prior Publication Data

US 2002/0125518 A1 Sep. 12, 2002

Related U.S. Application Data

(63) Continuation of application No. PCT/DE00/03209, filed on Sep. 15, 2000.

(30) Foreign Application Priority Data

Sep. 28, 1999 (DE) .......................... 199 46 437

(51) Int. Cl.⁷ .............................................. H01L 29/76
(52) U.S. Cl. .................. 257/295; 257/295; 257/324; 257/388; 257/389; 257/395; 257/406; 438/3; 438/216; 438/288
(58) Field of Search ........................... 257/295, 324, 257/388, 389, 395, 406; 438/3, 216, 288

(56) References Cited

U.S. PATENT DOCUMENTS

| | | | |
|---|---|---|---|
| 5,312,790 A | | 5/1994 | Sengupta et al. |
| 5,436,481 A | * | 7/1995 | Egawa et al. ............... 257/324 |
| 5,519,566 A | * | 5/1996 | Perino et al. ............. 361/321.4 |
| 5,572,052 A | * | 11/1996 | Kashihara et al. .......... 257/295 |
| 5,621,681 A | | 4/1997 | Moon |
| 5,877,977 A | * | 3/1999 | Essaian ....................... 365/145 |
| 5,955,755 A | | 9/1999 | Hirai et al. |
| 6,017,823 A | * | 1/2000 | Shishiguchi et al. ........ 438/696 |
| 6,084,260 A | * | 7/2000 | Hirai et al. ................... 257/295 |
| 6,097,058 A | * | 8/2000 | Nakamura et al. .......... 257/316 |
| 6,100,204 A | * | 8/2000 | Gardner et al. ............. 438/765 |
| 6,107,656 A | * | 8/2000 | Igarashi ....................... 257/295 |
| 6,144,060 A | | 11/2000 | Park et al. |
| 6,194,748 B1 | * | 2/2001 | Yu ............................... 257/216 |
| 6,255,121 B1 | * | 7/2001 | Arita et al. ..................... 438/3 |
| 6,413,820 B2 | * | 7/2002 | Bui ............................. 438/257 |

FOREIGN PATENT DOCUMENTS

| | | |
|---|---|---|
| EP | 0 566 585 B1 | 10/1993 |
| JP | 03 227 052 | 10/1991 |
| JP | 11 054 718 A | 2/1999 |

OTHER PUBLICATIONS

Yong Tae Kim et al.: "Memory window of Pt/SrBi$_2$Ta$_2$O$_9$/CeO$_2$/SiO$_2$/Si structure for metal ferroelectric insulator semiconductor field effect transistor", Appl. Phys. Lett., vol. 71, No. 24, Dec. 15, 1997, pp. 3507–3509.

In Seon Park et al.: „Ultra–thin EBL (Encapsulated Barrier Layer) for Ferroelectric Capacitor, IEDM 1997, pp. 617–620.

(List continued on next page.)

*Primary Examiner*—George Eckert
*Assistant Examiner*—Edgardo Ortiz
(74) *Attorney, Agent, or Firm*—Laurence A. Greenberg; Werner H. Stemer; Ralph E. Locher

(57) ABSTRACT

In a ferroelectric transistor containing two source/drain zones with a channel region disposed there-between, a first dielectric intermediate layer containing Al$_2$O$_3$ is disposed on a surface of the channel region. A ferroelectric layer and a gate electrode are disposed above the first dielectric intermediate layer. The utilization of Al$_2$O$_3$ in the first dielectric intermediate layer results in the suppression of tunneling of compensation charges from the channel region into the first dielectric layer and thereby improves the time for data storage.

9 Claims, 1 Drawing Sheet

OTHER PUBLICATIONS

Ho Nyung Lee et al.: „Fabrication of Metal–Ferroelectric–Insulator–Semiconductor Field Effect Transistor (MEFIS-FET) using Pt–SrBi$_2$Ta$_2$O$_9$–YO$_3$–Si Structure, Extended Abstracts of the 1997 International Conference on Solid State Devices and Materials, Hamamatsu, 1997, pp. 382–383.

F. Le Marrec et al.: "Croissance et étude structurale de couches minces et d'hétérostructures épitaxiées á base de Pb$_9$Zr$_{0.52}$Ti$_{0.48}$O$_3$ déposées sur des substrats de SrTiO$_3$ et Al$_2$O$_3$ par ablation laser" [growth and structural study of thin layers and epitaxial heterostructures based on Pb$_9$Zr$_{0.52}$Ti$_{0.48}$O$_3$ deposited on substrates made from SrTiO$_3$ et Al$_2$O$_3$ by ablation laser], Le Vide, No. 289, 1998, pp. 601–606.

* cited by examiner

FERROELECTRIC TRANSISTOR

CROSS-REFERENCE TO RELATED APPLICATION

This application is a continuation of copending International Application No. PCT/DE00/03209, filed Sep. 15, 2000, which designated the United States.

BACKGROUND OF THE INVENTION

FIELD OF THE INVENTION

The present invention relates to a ferroelectric transistor which contains two source/drain zones, a channel region and a gate electrode. A ferroelectric layer—that is to say, a layer of ferroelectric material—is provided between the gate electrode and the channel region. The conductivity of the transistor is dependent on a polarization state of the layer of ferroelectric material. Such ferroelectric transistors are being studied in relation to non-volatile memories, among other applications. Two different polarization states of the ferroelectric layer are therein allocated to two different logic values of an item of digital information. Neural networks are another possibility for applying such ferroelectric transistors.

Because the ferroelectric material which is disposed on a surface of a semiconductor substrate exhibits poor boundary surface characteristics, which exert an adverse effect on the electrical characteristics of a ferroelectric transistor, it has been proposed that an intermediate layer be utilized in a ferroelectric transistor between the ferroelectric layer and the semiconductor material. This guarantees a sufficient boundary surface at the surface of the semiconductor substrate (see European Patent EP 0 566 585 B1 and H. N. Lee et al, *Ext. Abst. Int. Conf. SSDM, Hamatsu* 1997: pp. 382–83). Insulating stable oxides such as $CeO_2$ or $ZrO_2$ are typically utilized for the intermediate layer.

SUMMARY OF THE INVENTION

It is accordingly an object of the invention to provide a ferroelectric transistor which overcomes the above-mentioned disadvantages of the prior art devices of this general type, in which a data retention storage time is longer than in the prior art.

With the foregoing and other objects in view there is provided, in accordance with the invention, a ferroelectric transistor. The transistor contains a semiconductor substrate, and two source/drain zones disposed in the semiconductor substrate. A space between the two source/drain zones defines a channel region having a surface. A dielectric intermediate layer containing an $Al_2O_3$ layer is disposed on the surface of the channel region. A ferroelectric layer is disposed above the dielectric intermediate layer and a gate electrode is disposed above the dielectric intermediate layer.

The data retention storage time refers to the time during which the polarization of the ferroelectric layer and with it the stored information remain saved.

The invention is thus based on the now described consideration. In a ferroelectric transistor as taught in the prior art, the ferroelectric layer is disposed between the intermediate layer and the gate electrode. For purposes of compensating the remanent electric field that is brought about by the polarization in the ferroelectric layer, compensation charges occur on the gate electrode, on one hand, and in the semiconductor substrate in the region of the channel of the transistor, on the other hand.

The compensation charges located in the semiconductor substrate in the region of the channel of the transistor can be injected by thermally excited charge injection (i.e. Schottky emission) into the conduction band of the insulator from which the intermediate layer is formed, and can thereby reach the boundary surface between the intermediate layer and the ferroelectric layer. If the transistor is subsequently driven under the opposite polarity, the charges compensate the electric field brought about by the polarization of the ferroelectric layer. As a result, the underlying transistor channel can no longer be controlled by the polarization of the ferroelectric layer. The data storage time of the ferroelectric transistor is thus shortened.

In the inventive ferroelectric transistor, this effect is prevented in that the first dielectric intermediate layer contains $Al_2O_3$. $Al_2O_3$ has a band gap larger than 8 eV, compared to approximately 4 eV for $CeO_2$ or $ZrO_2$, which are utilized as the intermediate layer in conventional ferroelectric transistors. In the inventive ferroelectric transistor, the thermally excited charge injection is precluded due to the substantially higher potential barriers in $Al_2O_3$. Charge carriers can only be injected into the first dielectric intermediate layer when they tunnel through the forbidden band of the $Al_2O_3$. The tunnel mechanism is several orders of magnitude smaller than the thermally excited charge injection in conventional ferroelectric transistors.

If the first dielectric intermediate layer is 5 nm thick, then 4 volts would have to drop across the first dielectric intermediate layer in order for a charge transport by Fowler-Nordheim tunneling from the channel region of the transistor into the first dielectric intermediate layer to set in. Given a realistic mode of operation, at most 0.1 to 1.5 volts drop across the first dielectric intermediate layer. Leakage currents from the channel region into the first dielectric intermediate layer are thus actively suppressed.

In accordance with an added feature of the invention, the dielectric intermediate layer has a thickness of between 5 and 20 nm.

In accordance with an additional feature of the invention, the dielectric intermediate layer is formed of multiple layers. The dielectric intermediate layer further contains $SiO_2$ or $Si_3N_4$.

Preferably, a second dielectric intermediate layer is disposed between the ferroelectric layer and the gate electrode. With the aid of the second dielectric intermediate layer, leakage currents of compensation charges on the gate electrode are suppressed to the boundary surface between the ferroelectric layer and the first dielectric intermediate layer by the ferroelectric layer. The leakage currents can also reduce the data storage time of the ferroelectric transistor, because they compensate the electric field caused by the polarization of the ferroelectric layer given repoling of the transistor. As a result, the underlying transistor channel can no longer be controlled by the polarization of the ferroelectric layer. In this embodiment, because the gate electrode does not adjoin the ferroelectric layer directly but rather is isolated from it by the second dielectric intermediate layer, leakage currents from the gate electrode are suppressed by the ferroelectric layer. This improves the functionality of the ferroelectric transistor and lengthens the data storage time.

In accordance with another feature of the invention, the second dielectric intermediate layer is formed of $Al_2O_3$, $CeO_2$ or $ZrO_2$, and has a thickness between 2 and 20 nm. Furthermore, the second dielectric intermediate layer is formed of multiple layers and additionally contains $SiO_2$ or $Si_3N_4$.

In order to change the polarization of the ferroelectric layer of the ferroelectric transistor, a voltage is usually applied between the semiconductor substrate and the gate electrode. The first dielectric intermediate dielectric layer, the ferroelectric layer, and the second dielectric intermediate layer therein represent a series circuit of capacitances. The first and second dielectric intermediate layers are therefore preferably made of a material with a sufficiently large dielectricity constant that the capacitances of the first dielectric intermediate layer and the second dielectric intermediate layer exert optimally little electrical influence on the ferroelectric transistor. $Al_2O_3$ has a dielectricity constant between 9 and 12, so that this condition is satisfied for the first dielectric intermediate layer.

It is within the scope of the invention to form the second dielectric intermediate layer from $Al_2O_3$, $CeO_2$ or $ZrO_2$. The first dielectric intermediate layer and the second dielectric intermediate layer can be formed from the same material or different materials. All materials with a large dielectric constant are particularly well suited. Utilizing $Al_2O_3$ for the second dielectric intermediate layer is advantageous in that a thermally excited charge injection (or Schottky emission) from the gate electrode into the ferroelectric layer is suppressed.

The first and/or second dielectric intermediate layers can also be formed as multi-layers if this is technically expedient. The first and/or second dielectric intermediate layers can additionally contain either $Si_3N_4$ or $SiO_2$.

In order to completely rule out leakage currents through the ferroelectric layer, it is advantageous also to isolate the ferroelectric layer laterally by dielectric flank coverings, in addition to the first and second dielectric intermediate layers. $Al_2O_3$, $CeO_2$ or $ZrO_2$ are likewise suitable for the dielectric flank coverings.

In the region of the ferroelectric transistor, the semiconductor substrate contains at least one material that is suitable for realizing an electronic circuit component. It preferably contains silicon and/or germanium. In particular, a monocrystalline silicon wafer or silicon-on-insulator (SOI) substrate is a suitable semiconductor substrate.

All ferroelectric materials which are suitable for utilization in a ferroelectric transistor are suitable materials for the ferroelectric layer. It preferably contains silicon and/or geranium. Specifically, the ferroelectric layer contains SBT ($SrBi_2Ta_2O_9$), PZT ($PbZr_xT_{1-x}O_2$), $LiNbO_3$ or BMF ($BaMgF_4$).

Doped polysilicon, platinum or tungsten are particularly suitable for the gate electrode. Beyond this, the gate electrode can be realized as a multi-layered structure. In particular, a diode structure can be realized in such a multi-layered structure.

The ferroelectric transistor can be realized as either a p or n channel transistor. It can be realized as either an enhancement transistor or a depletion transistor.

Other features which are considered as characteristic for the invention are set forth in the appended claims. Although the invention is illustrated and described herein as embodied in a ferroelectric transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
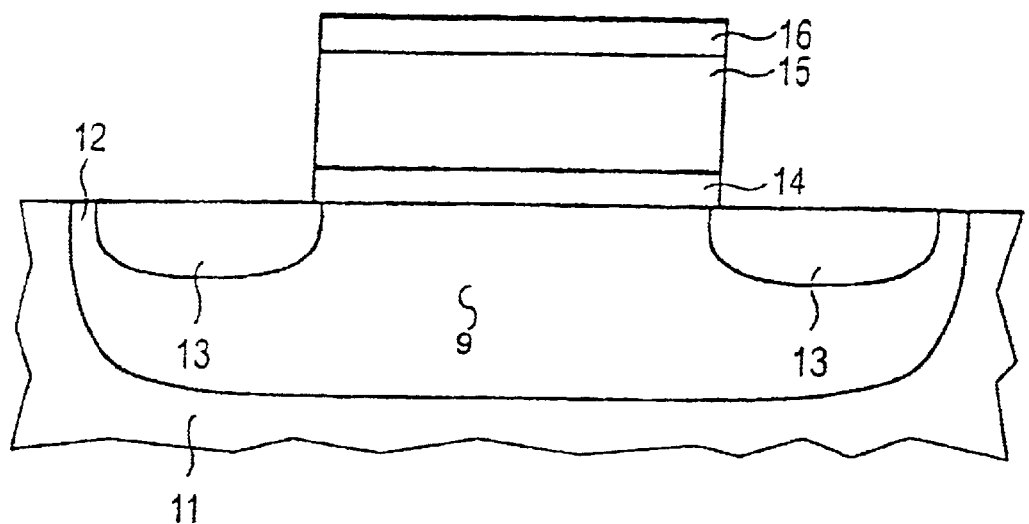
FIG. 1 is a diagrammatic, sectional view through a ferroelectric transistor wherein a ferroelectric layer is disposed between a first dielectric intermediate layer and a gate electrode.

Referring now to the figures of the drawing in detail and first, particularly, to FIG. 1 thereof, there is shown a semiconductor substrate 11 formed of an n-doped monocrystalline silicon with a dopant concentration of several $10^{15}$ $cm^{-3}$, and a p-doped trough 12 which has a dopant concentration of several $10^{16}$ $cm^{-3}$. Disposed in the p-doped trough 12 are two source/drain zones 13, which are $n^+$ doped with a dopant concentration of several $10^{20}$ $cm^{-3}$, respectively.

The part of the p-doped trough 12 adjoining a surface of the semiconductor substrate 11 between the two source/drain zones 13 acts as a channel region 9. The channel region 9 of the transistor can contain an additional dopant for setting a threshold voltage. A first dielectric intermediate layer 14 is disposed at the surface of the channel region 9. The first dielectric intermediate layer 14 contains $Al_2O_3$ and is 5 to 7 nm thick.

A ferroelectric layer 15 that contains SBT and is approximately 100 to 150 nm thick is disposed on the surface of the first dielectric intermediate layer 14.

A platinum gate electrode 16 is disposed on the surface of the ferroelectric layer 15. The gate electrode 16 is approximately 50 to 100 nm thick.

Figure 2:
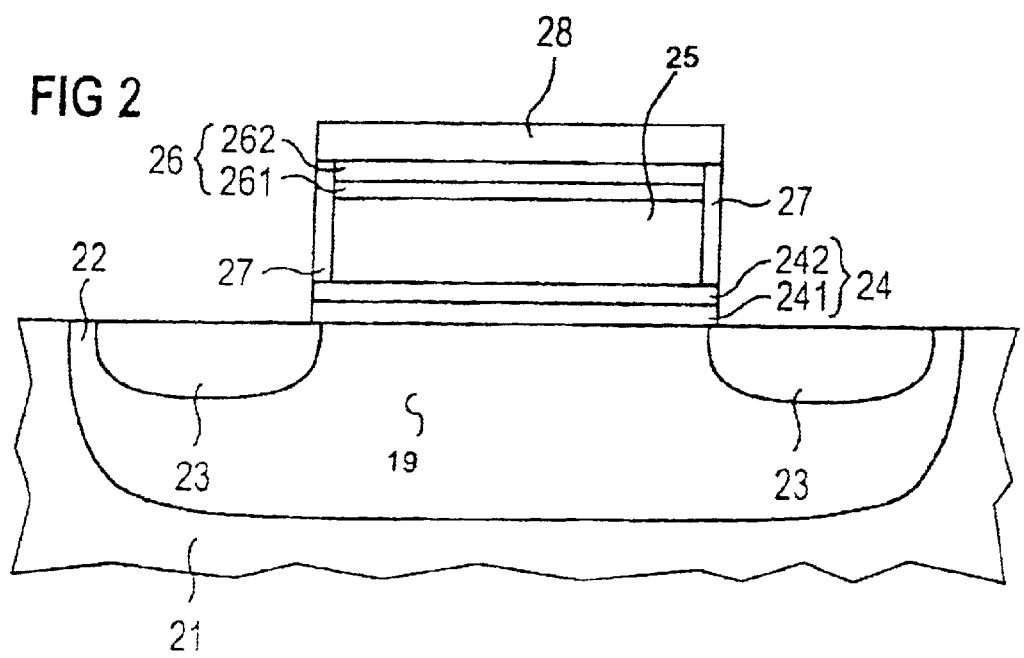
FIG. 2 is a sectional view through the ferroelectric transistor wherein the ferroelectric layer is completely surrounded by a dielectric material.

In FIG. 2, a semiconductor substrate 21 formed of an n-doped monocrystalline silicon with a dopant concentration of several $10^{15}$ $cm^{-3}$ is shown. A p-doped trough 22 with a dopant concentration of several $10^{16}$ $cm^{-3}$ is formed in the substrate 21. Disposed in the p-doped trough 22 are two source/drain zones 23, which are $n^+$-doped with a dopant concentration of several $10^{20}$ $cm^{-3}$.

The part of the p-doped trough 22 between the two source/drain zones 23 acts as a channel region 19. The channel region 19 of the transistor can contain an additional doping for setting the threshold voltage. Disposed at the surface of the channel region 19 is a first dielectric intermediate layer 24, which is composed of a 1 to 2 nm thick $SiO_2$ layer 241 and a 3 to 4 nm thick $Al_2O_3$ layer 242. Disposed at the surface of the first dielectric layer 24 is a ferroelectric layer 25 formed of SBT with a thickness of 100 to 150 nm.

Disposed at a surface of the ferroelectric layer 25 is a second dielectric intermediate layer 26, which is composed of a $CeO_2$ layer 261 with a thickness between 3 and 4 nm, and an $Si_3N_4$ layer 262 with a thickness between 1 and 3 nm. The edges of the ferroelectric layer 25 and the second dielectric intermediate layer 26 are covered by dielectric edge coverings 27 formed of $CeO_2$ or $Al_2O_3$. Alternatively, the second dielectric intermediate layer 26 is composed of an $Al_2O_3$ layer 261 with a thickness between 3 and 4 nm and an $Si_3N_4$ layer 262 with a thickness between 1 and 3 nm.

Disposed at the surface of the second dielectric layer 26 is a gate electrode 28, which contains $n^+$-doped polysilicon. The gate electrode 28 has a thickness between 100 and 200 nm.

The fabrication of the inventive ferroelectric transistor is similar to that of a standard MOS transistor. The first intermediate layer 14 or 24, the ferroelectric layer 15 or 25, respectively, and the second dielectric intermediate layer 26, are formed by deposition, for instance in a chemical vapor deposition (CVD) process, followed by structuring. The p-doped trough 12 or 22 and the source/drain zones 13 or 23, respectively, are formed by implantation or diffusion.

The gate electrode 16 or 28, respectively, is created by deposition or sputtering followed by structuring. It can be utilized as a hard mask for structuring the underlying layers.

The dielectric edge coverings 27 can be created as spacers by deposition and anisotropic etch-back. Alternatively, they can be created from the same material as the second dielectric intermediate layer. In this case, the second dielectric layer is deposited and structured after the structuring of the ferroelectric layer. The second dielectric intermediate layer and the dielectric edge coverings form a contiguous structure in this case.

We claim:

1. A ferroelectric transistor, comprising:
   a semiconductor substrate;
   two source/drain zones disposed in said semiconductor substrate, a space between said two source/drain zones defining a channel region having a surface;
   a first dielectric intermediate layer containing an $Al_2O_3$ layer disposed on said surface of said channel region;
   a ferroelectric layer disposed above said first dielectric intermediate layer and having a surface and edges;
   a second dielectric intermediate layer disposed on said surface of said ferroelectric layer, said second dielectric intermediate layer containing an $Al_2O_3$ layer, and dielectric edge coverings formed of the same material as said second intermediate layer and surrounding said edges of said ferroelectric layer, said second dielectric intermediate layer and said edge coverings forming a contiguous structure for reducing leakage currents through said ferroelectric layer; and
   a gate electrode disposed on said second dielectric intermediate layer.

2. The ferroelectric transistor according to claim 1, wherein said first dielectric intermediate layer has a thickness of between 5 and 20 nm.

3. The ferroelectric transistor according to claim 1, wherein said first dielectric intermediate layer is formed of multiple layers.

4. The ferroelectric transistor according to claim 3, wherein said first dielectric intermediate layer further contains a material selected from the group consisting of $SiO_2$ and $Si_3N_4$.

5. The ferroelectric transistor according to claim 1, wherein said second dielectric intermediate layer is formed of a material selected from the group consisting of $Al_2O_3$, $CeO_2$ and $ZrO_2$, and has a thickness between 2 and 20 nm.

6. The ferroelectric transistor according to claim 1, wherein said second dielectric intermediate layer is formed of multiple layers.

7. The ferroelectric transistor according to claim 6, wherein said second dielectric intermediate layer further contains a material selected from the group consisting of $SiO_2$ and $Si_3N_4$.

8. The ferroelectric transistor according to claim 1, wherein said dielectric edge coverings contain a material selected from the group consisting of $Al_2O_3$, $CeO_2$, $ZrO_2$, $SiO_2$ and $Si_3N_4$.

9. The ferroelectric transistor according to claim 1, wherein:
   said ferroelectric layer contains a material selected from the group consisting of $SrBi_2Ta_2O_9$, $PbZr_xTi_{1-x}O_2$, $LiNbO_3$ and $BaMgF_4$; and
   said gate electrode contains a material selected from the group consisting of doped polysilicon, platinum and tungsten.

* * * * *